United States Patent [19]

Cnyrim et al.

[11] Patent Number: 4,959,750
[45] Date of Patent: Sep. 25, 1990

[54] PRINTED CIRCUIT BOARD FOR CARRYING A MIXED-COMPONENT ASSEMBLY

[75] Inventors: Henner Cnyrim, Laatzen; Peter Felsen, Wennigsen, both of Fed. Rep. of Germany

[73] Assignee: WABCO Westinghouse Fahrzeugbremsen GmbH, Hanover, Fed. Rep. of Germany

[21] Appl. No.: 209,658

[22] Filed: Jun. 21, 1988

[30] Foreign Application Priority Data

Jun. 25, 1987 [DE] Fed. Rep. of Germany ....... 3720925

[51] Int. Cl.⁵ .............................................. H05K 1/18
[52] U.S. Cl. ...................................... 361/401; 361/406
[58] Field of Search ............... 361/400, 401, 404, 406; 174/52, 4

[56] References Cited

U.S. PATENT DOCUMENTS

| | | | |
|---|---|---|---|
| 2,898,520 | 8/1959 | Sterner | 361/406 X |
| 3,219,886 | 11/1965 | Katzin | 361/401 X |
| 3,264,525 | 8/1966 | Swengel | 361/404 X |
| 4,281,361 | 7/1981 | Patz et al. | 361/401 |
| 4,361,862 | 11/1982 | Martyniak | 361/401 X |
| 4,604,678 | 8/1986 | Hagner | 361/401 |
| 4,732,446 | 3/1988 | Gipson et al. | 361/401·X |

FOREIGN PATENT DOCUMENTS 3527043 2/1987 Fed. Rep. of Germany.

*Primary Examiner*—Gregory D. Thompson
*Attorney, Agent, or Firm*—Horst M. Kasper

[57] ABSTRACT

A printed circuit board provided for mixed-component assembly of electrically hard-wired and surface-mounted components which eliminates the difficulties of bonding large components and which alleviates thermal shock and stress during the soldering of the contacts by a flow bath process. The printed circuit boards for mixed-component assembly are capable of utilizing PLCC components which, in many cases, are difficult to mount on a printed circuit board. The printed circuit board includes at least one recess for receiving and holding a PLCC component. The sides of the recess are provided with conductive indentations which serve to guide the PLCC component during insertion and which provide soldering points for electrical connections.

3 Claims, 1 Drawing Sheet

PRINTED CIRCUIT BOARD FOR CARRYING A MIXED-COMPONENT ASSEMBLY

FIELD OF THE INVENTION

This invention relates to a printed circuit board and, more particularly, to a printed circuit board manufactured of insulated carrier material, on which is mounted at least one conductive track for accommodating the insertion of at least one of a number of surface-mounted components. At least one recess is provided, the dimensions of which approximately correspond to those of the base surface of the surface-mounted component to be inserted, and at least one side wall of the recess is equipped with at least one bonding element serving as an electrical connection of the track with an electric connection of the surface-mounted component.

BACKGROUND OF THE INVENTION

Printed circuit boards with tracks of this type are required for electronic circuits in which, as a rule, different electronic components have to be interconnected in a certain manner. The steps of drilling through the printed circuit boards equipped with tracks at the points where the components are connected and of inserting the wire leads of the respective components into the bore holes and of soldering them to the tracks is known in the art. Furthermore, the use of the so-called surface-mounted devices (SMD), in which the devices are initially glued onto the printed circuit board, by placing the connecting points on the projected tracks and then soldering them together, is also known in the art. This technique uses smaller components, which are arranged in a flat configuration to save space. In addition, the latter manufacturing process is less costly and expensive, due to the elimination of the drilling procedure.

Since many of the available components are only offered in SMD technology for certain purposes and since these components are already used for reasons of cost, it is often necessary to combine different kinds of electronic components on the same printed circuit board to form a mixed assembly.

Printed circuit boards of this kind of mixed assembly are known to the art and are described in a brochure entitled "Siemens-Teststrategie und Prufverfahren four SMD-Gruppen", which translated means "Siemens Test Strategy and Testing Procedure for SMD Assemblies", issue No. 53 d 7/86, by Siemens Aktiengesellshaft (AB). This brochure describes printed circuit boards which have hard-wired components mounted on the one or upper side thereof. These printed circuit boards are normally equipped with tracks in which the connecting points are provided with bore holes into which the conductive leads of the hard-wired components are inserted and soldered. The SMD components, on the other hand, are normally glued to the underside of the printed circuit boart. The SMD components are glued on by placing the contact surfaces of the components on the projected tracks. The entire printed circuit board assembly can be soldered in a single procedure by flow soldering. The SMD components are immersed into the soldering bath as a complete assembly. During this flow soldering process, it is possible that all of the components may be briefly touched by hot molten solder on all sides. However, since some SMD components cannot withstand a thermal shock or stress of this intensity, a soldering assembly of this kind on a printed circuit board may not be always possible.

OBJECTS AND SUMMARY OF THE INVENTION

Therefore, it is an object of this invention of developing a printed circuit board in such a way that the surface-mounted components are exposed essentially to low thermal shock or stress during soldering.

A further object of this invention is to provide a new and improved manufacturing process for assembling electronic components on a printed circuit board.

It is conceivable in the assembly of printed circuit boards to expose the SMD components to only a low thermal shock or stress by employing reflow soldering. In such a case, the SMD components are first mounted to one side of the printed circuit board and are then soldered by the reflow method. A subsequent step then consists of assembling the hard-wired components on the same side of the printed circuit board, and then soldering by the flow method on the other side. However, this leads to brief reheating of the soldered joints of the SMD components which can, in some cases, result in defective connections in the area of the soldered joints. The consequence is an increase in the rate of infant manufacturing mortalities, and it is quite possible that the defect in the soldered joint will become a functional failure, even after a longer period of operation. Such soldered joints of this kind represent too great, a potential risk, in particular for safety-related circuits, such as those used in wheel slip ABS brake systems, and therefore, they are not suitable for guaranteeing the required safety operation.

Therefore, this invention possesses an advantage that the heat-sensitive, surface-mounted components are placed into a suitable recess formed in the printed circuit board. Such an arrangement makes it possible to position the component in the recess in such a way that during flow soldering, the solder bath touches or contacts only the contact pins or the underside of the surface-mounted components. This leads to a considerably lower thermal shock or stress than the previous method of immersing or inserting the entire component through the solder bath.

Furthermore, the invention also has the advantage of increasing the card file density since the SMD components are mounted in the recess. This is due to the fact that the SMD components are disposed in the space in the recess, and thus, the printed circuit boards are capable of being placed closer together.

At the same time, the invention also has the advantage of facilitating testing of the SMD components mounted in the recess. The contacts or junction points of the SMD component can be visually examined and are readily accessible from each side of the printed circuit board. This is due to the recess mounting in the printed circuit board and due to the positioning of the bonding elements on the side walls of the recess of the printed circuit board. Therefore, it is possible to conduct a visual examination as well as to take electrical measurements of components from both sides of the printed circuit board.

In addition, the present invention has the advantage that a lower failure rate is achieved in the manufacture of printed circuit boards. By mounting the SMD components in the recess, the insertion or immersion of the entire components through the solder bath can be replaced by inserting or immersing only their contacts.

This makes it possible to avoid the loss of soldering material between the components or between the component connection joints so that there is no considerable reduction of the soldered surfaces when wetted by the solder.

A particular advantage for a printed circuit board for mixed-component assembly lies in the fact that this invention makes it possible to mount components from one side of the printed circuit board. Due to the recess, the SMD components can be positioned in the space provided for them from the same side of the printed circuit board as the hard-wired components.

In one embodiment of the invention, the SMD components are fitted into the recess in such a way that wire leads contact the solder junction material situated on the recess walls and are securely held in place within the recess by the spring force of the wire leads. This is particularly advantageous with the SMD components since the construction of their casings do not have a surface which needs to be soldered, and thus, it is not necessary to immerse the casing through the solder bath

DESCRIPTION OF THE DRAWINGS

The above objects and other attendant features and advantages will be more readily appreciated as the present invention becomes better understood by reference to the following detailed description when considered in conjunction with the accompanying drawings, wherein.

DETAILED DESCRIPTION OF THE INVENTION

Figure 1:
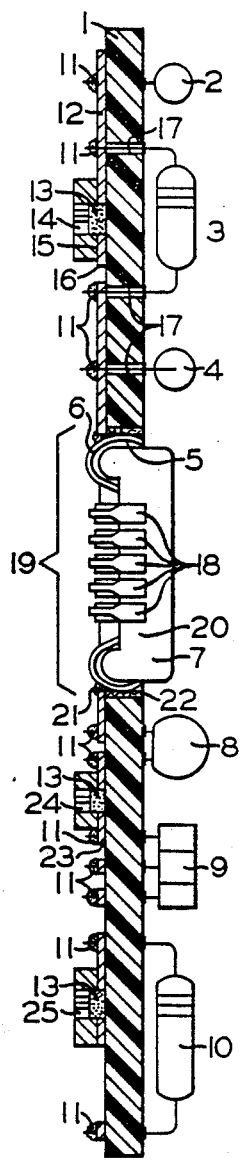
FIG. 1 shows a longitudinal section of a printed circuit board having mixed-component assembly and having an SMD component mounted in a recess.
Figure 2:
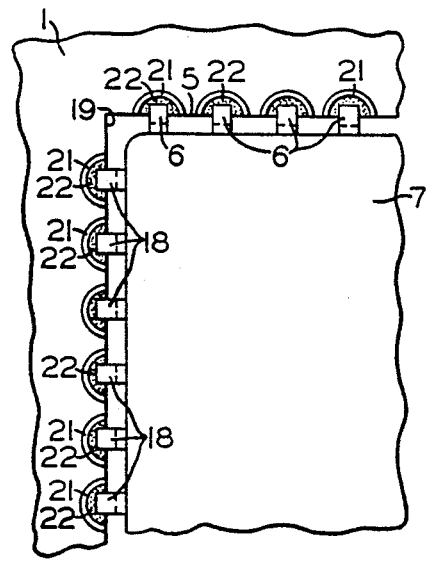
FIG. 2 shows a partial enlarged top plan view of the printed circuit board, according to FIG. 1, in which the SMD component is fitted in the recess.

Referring now to FIG. 1 of the drawings, there is shown a printed circuit board, generally characterized by numeral 1, for carrying a mixed-component assembly. Also shown is a surface-mounted device (SMD) 7 having a casing in the form of a plastic leaded chip carrier (PLCC) and fitted into a recess formed in the printed circuit board.

The printed circuit board 1 consists of a conventional insulated or plastic substrate material having conductive solder-coated tracks 12 and 23 which are mounted on one of its flat sides, namely, the underside. The hard-wired resistor 2, 3, and 4, a hard-wired condenser 8, and a hard-wired transistor 9 are mounted on the top side of the printed circuit board. The wire leads are inserted through suitable bore holes 17 drilled in the printed circuit board and are soldered to the conductive tracks 12, 2 in any conventional manner. The SMD components 14, 24, and 25 are additionally mounted onto the underside of the printed circuit board 1, which includes the soldering joints 11 for the hard-wired components 2, 3, and 4, as well as hard-wired components 8, 9, and 10. The individual SMD components are preferably initially positioned on the printed circuit board 1 with the aid of a suitable adhesive 13, such as, a PVC compound. The contact surfaces 15 of these components are placed against the corresponding tracks 12 and are suitably connected by soldering. The conductive tracks 12 at these points are designed as contact surfaces 16. A mixed electrical component assembly of this kind, on printed circuit boards, results in a high density package-type structure for accommodating a large number of components.

An assembly of this kind, which employs SMD components, is, in principle, possible for all types of printed circuit boards. These printed circuit boards not only must have the corresponding contact surfaces 16 on the conductive tracks but also must have contact surfaces for the SMD components, which must be capable of withstanding thermal shock or stress. The thermal requirements are necessary because the printed circuit boards 1, as a rule, are soldered by insertion into the flow, and the entire surface of the SMD components is touched by hot solder during this process.

The printed circuit board 1 is provided at or about its center with a square recess 19, which is utilized for mounting an SMD component 7 having a PLCC casing. The casing of the SMD component is equipped with a series of connections which take the form of wire leads 6, 18, located around the peripheral edge. The recess 19 has dimensions which approximately correspond to the peripheral surface of the PLCC plastic casing 20, and is provided along its four side walls 5 with a plurality of semicircular indentations or notches 21 for accepting and holding the wire leads 6, 18. These notches or indentations 21 are coated with solder which serves as uniting elements 22 for the wire leads 6, 18. The solder-coated indentations 21 are connected to the respective conductive material or tracks 23 for providing electrical connection. However, the solder elements 22 can also be constructed in any number of different ways. The specific embodiment depends, above all, on the type of connections for connecting the respective components.

The wire leads 18, 6 flexibly-engage the walls of the indentations 21 which thus simultaneously form a mechanical retention for the component 7 and, therefore, there is no need for any special fastening during the soldering process.

The shape of the indentations 21 allows the respective wire leads 6, 18 to be automatically guided into the desired position during the assembly on the printed circuit board. Thus, the proper guidance for the component 7 is assured. This guidance function performed by the indentations 21 makes it possible to automatically equip the printed circuit board 1 with SMD components of this kind in such a way that the assembly of the wired components can occur simultaneously. There are no special requirements for exact positioning of the components, which are relatively small, with the subject automatic assembly.

It will be appreciated that the recess 19 does not have to be square, but may take any form or shape, depending on the shape of the component which is used. In principle, all SMD components can be mounted in a matching recess of this kind. However, this is only advisable for components which, due to their size and shape, cannot be bonded onto the printed circuit board or which, due to their temperature sensitivity, cannot be soldered without damage. Furthermore, the placement of components of this kind in recesses 19 makes it possible to solder the printed circuit board 1 in one single soldering procedure. During this process, the indentations 21 holding the wire leads 6, 18, cause the formation of a capillary affect which promotes a reliable solder joint. Furthermore, the recess 19 also allows a clear view and permits accurate control of the assembled components.

A printed circuit board with a recess 19 is particularly useful for components with PLCC casings, since these components often cannot be bonded to the printed circuit board due to their size and shape. These components normally cannot be replaced by components of different shape since, on many occasions, only one type of PLCC casing is offered.

A printed circuit board for mixed-component assembly with recesses is manufactured in the following manner:

Initially, a suitable commercially available printed circuit board 1 having the desired conductive circuit paths or tracks 12, 23 is selected. Subsequently, the holes for accommodating the wire leads of the hard-wired components 2, 3, 4, 8, 9, and 10 are drilled into appropriate points of the printed circuit board 1.

In addition, bore holes are drilled along the recess walls 5 of the projected recess 19. The centers of the bore holes are situated on the line of the recess sides. One bore hole is drilled for each of the conductive wire leads 6, 18 at the appropriate points in the printed circuit board 1.

Subsequently, the conductive tracks 12, 23 and the matching bore holes are solder-connected in the conventional manner. After this process, the recess for the SMD component 7 having the PLCC casing is worked in. The recess 19 is normally made by being punched out or reamed out. However, it is apparent that other matching operations may be used for forming the recess in the printed circuit board 1.

After the punching out, the square recess in the printed circuit board 1 and the side walls 5 are provided with the semicircular indentations or notches 21. These exposed surfaces of the indentations 21 are coated with solder for being electrically connected to the respective conductive tracks 12, 23.

The printed circuit board 1 subsequently receives the respective electrical components which are soldered by flow soldering in a single soldering procedure.

Thus, the present invention has been described in such full, clear, concise and exact terms as to enable any person skilled in the art to which it pertains to make and use the same, and having set forth the best mode contemplated of carrying out this invention. It is understood that the subject matter which we regard as being our invention is particularly pointed out and distinctly set forth in what is claimed. It will be understood that variations, modifications, equivalents and substitutions for components of the above specifically described embodiment of the invention may be made by those skilled in the art without departing from the spirit and scope of the invention as set forth in the appended claims.

We claim:

1. A printed circuit board manufactured of insulated carrier material having a plurality of conductive tracks comprising, indentations formed by bore holes for guiding a surface-mounted component into a recess, the recess is provided with the dimensions which approximately correspond to the peripheral surface of the surface-mounted component to be inserted, into said recess and a side wall of the recess is provided with a plurality of said indentations each having a contact surface with solder disposed thereon for being electrically connected to each of the plurality of conductive tracks for providing electrical connections to wire leads of the surface-mounted component and wherein the indentations automatically guide the wire leads to cause the exact positioning of the surface-mounted component in the printed cicuit board.

2. The printed circuit board, according to claim 1, wherein each contact surface is situated in such a way that it is located opposite the lead wires of the surface-mounted component upon being inserted so that the lead wires of the surface-mounted component may be electrically connected to a respective contact surface.

3. The printed circuit board, according to claim 1, wherein the bore holes are circular, wherein the axis of the bore holes are oriented approximately perpendicular to the surface of the printed circuit board so that the indentations have an approximately semicircular cross section which is perpendicular to the longitudinal axis of the bore holes.

* * * * *